United States Patent
Ooi et al.

(10) Patent No.: US 8,907,488 B2
(45) Date of Patent: Dec. 9, 2014

(54) MICROBUMP AND SACRIFICIAL PAD PATTERN

(71) Applicant: Broadcom Corporation, Irvine, CA (US)

(72) Inventors: Lynn Ooi, San Jose, CA (US); Sampath K V Karikalan, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 130 days.

(21) Appl. No.: 13/742,961

(22) Filed: Jan. 16, 2013

(65) Prior Publication Data

US 2014/0183748 A1 Jul. 3, 2014

Related U.S. Application Data

(60) Provisional application No. 61/746,698, filed on Dec. 28, 2012.

(51) Int. Cl.
*H01L 23/00* (2006.01)

(52) U.S. Cl.
CPC ............... *H01L 24/06* (2013.01); *H01L 24/03* (2013.01)

USPC .......................................... 257/773; 438/612

(58) Field of Classification Search
CPC ..................... H01L 24/03; H01L 24/06
USPC .......................................... 257/773; 438/612
See application file for complete search history.

(56) References Cited

U.S. PATENT DOCUMENTS

| 7,811,932 B2 * | 10/2010 | Pozder et al. | 438/666 |
| 2013/0256910 A1 * | 10/2013 | Lee et al. | 257/774 |
| 2014/0073127 A1 * | 3/2014 | Itaya et al. | 438/613 |

* cited by examiner

*Primary Examiner* — Walter H Swanson
(74) *Attorney, Agent, or Firm* — Sterne, Kessler, Goldstein & Fox PLLC (57) ABSTRACT

Embodiments described herein generally relate to connections for integrated circuit (IC) dies. For example, in an embodiment an integrated circuit (IC) die is provided. The IC die includes a plurality of clusters of pads formed on a surface of the IC die, each cluster being associated with a respective circuit formed in the IC die. Each cluster includes a plurality of micropads each electrically coupled to the circuit associated with the cluster through a respective via and a sacrificial pad coupled to the circuit through the plurality of micropads, the sacrificial pad being larger than each of the micropads.

20 Claims, 8 Drawing Sheets

MICROBUMP AND SACRIFICIAL PAD PATTERN

CROSS REFERENCE TO RELATED APPLICATIONS

This application claims the benefit of U.S. Provisional Appl. No. 61/746,698, filed Dec. 28, 2012, which is incorporated by reference herein in its entirety.

BACKGROUND

1. Field

Embodiments described herein generally relate to connections for integrated circuit (IC) dies in IC packages.

2. Background

Integrated circuit (IC) devices generally include an IC die that is housed in an IC package. The IC package can include a substrate that is used to couple the IC die to a printed circuit board (PCB). For example, the IC die can be electrically coupled to the substrate (e.g., using wirebonds or flip chip connections). The substrate can include traces and/or vias that route connections of the IC die to the PCB. The PCB can electrically couple different IC packages mounted on it.

As IC designs become increasingly complex, the size of the die needed to implement the design also increases. Larger IC dies, however, have drawbacks including, high manufacturing costs and diminished yield. To address problems with larger dies, IC designs are often modularized and implemented as separate dies. The separate dies can be housed in the same IC package to maximize the number of interconnections between them. These devices are referred to as multi-chip devices. To further increase the number of interconnections between the IC dies, the size of the connections between the IC dies and the rest of the IC package can be reduced. For example, instead of using C4 bumps, which have a minimum pitch of approximately 150 μm and a diameter of approximately 90 μm, microbumps having a minimum pitch of approximately 40 μm and a diameter of approximately 20 μm can be used. interposers can be used to facilitate connections between microbumps and the package substrate.

To connect to these microbumps, IC dies require appropriately sized pads. Probes used to test IC dies, however, are generally configured for larger pads (e.g., those used with C4 bumps). When these probes make contact with the smaller-sized pads, the pads can be damaged.

BRIEF DESCRIPTION OF THE DRAWINGS/FIGURES

The accompanying drawings, which are incorporated herein and form a part of the specification, illustrate the disclosed subject matter and, together with the description, further serve to explain the principles of the contemplated embodiments and to enable a person skilled in the pertinent art to make and use the contemplated embodiments.

DETAILED DESCRIPTION

I. Overview

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described can include a particular feature, structure, or characteristic, but every exemplary embodiment can not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications can be made to the exemplary embodiments within the spirit and scope of the disclosure. Therefore, the Detailed Description is not meant to limit the disclosure. Rather, the scope of the disclosure is defined only in accordance with the following claims and their equivalents.

The following Detailed Description of the exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein may be spatially arranged in any orientation or manner.

Embodiments described herein generally relate to connections for integrated circuit (IC) dies. For example, in an embodiment an integrated circuit (IC) die is provided. The IC die includes a plurality of clusters of pads formed on a surface of the IC die, each cluster being associated with a respective circuit formed in the IC die. Each cluster includes a plurality of micropads and a sacrificial pad coupled. Each of the plurality of micropads is electrically coupled to the circuit associated with the cluster through a respective via and the sacrificial pad is coupled to the circuit through the plurality of micropads. The sacrificial pad is larger than each of the micropads.

In another embodiment, a method of manufacturing an integrated circuit (IC) dies provided. The method includes forming a plurality of circuits in a substrate and forming a plurality of clusters on a surface of the substrate. Each cluster includes a plurality of micropads and a sacrificial pad. Each of the micropads is electrically coupled through a respective via to a circuit respective to the cluster and each of the sacrificial pad is coupled to the circuit through the plurality of micropads. The sacrificial pad is larger than each of the micropads.

II. Introduction

Figure 1:
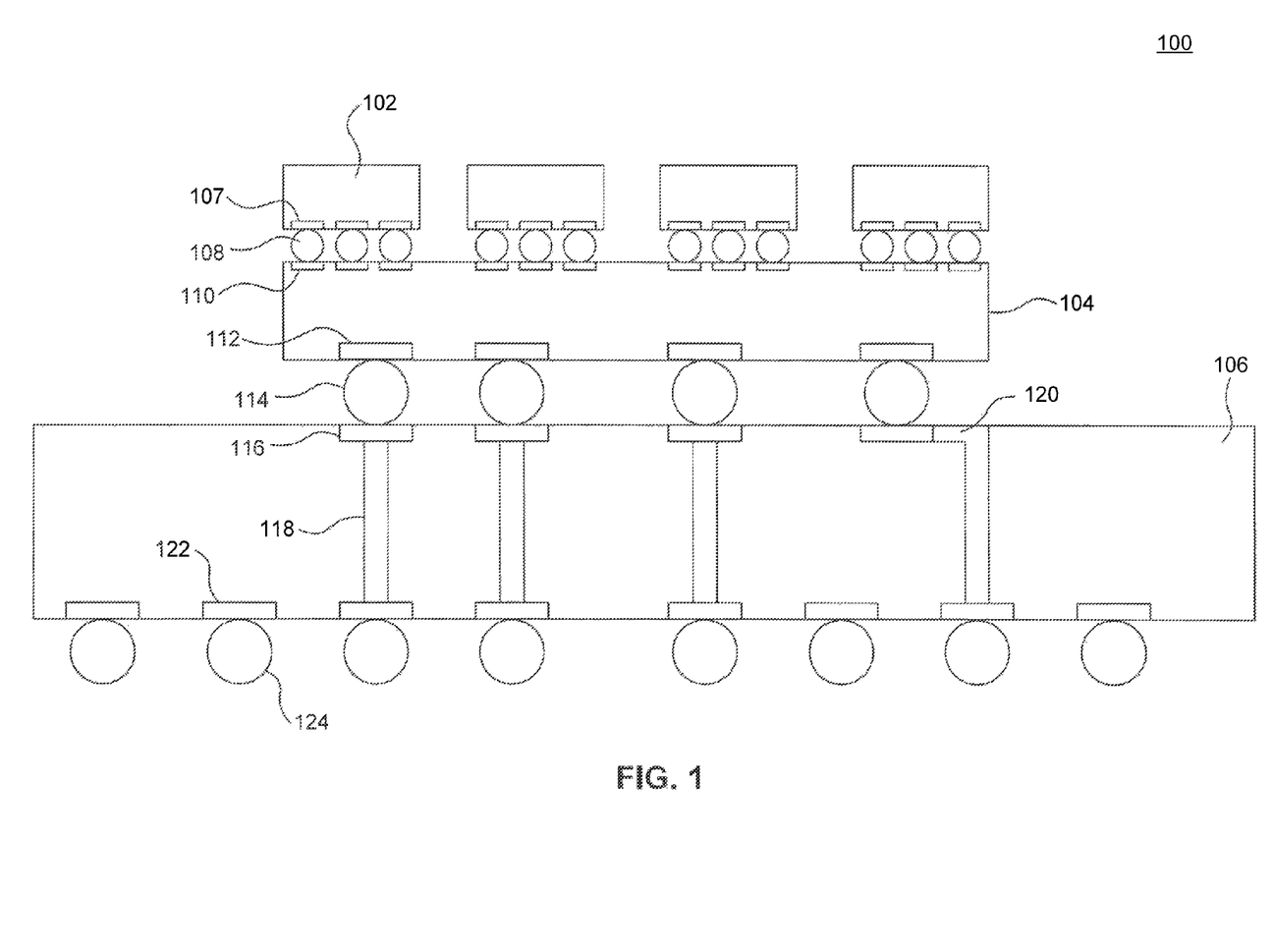
FIG. 1 shows a cross-sectional diagram of a multichip integrated circuit (IC) device.

FIG. 1 shows a cross-sectional diagram of a multichip integrated circuit (IC) device 100. IC device 100 includes IC dies 102, an interposer 104, and a package substrate 106. IC dies 102 are coupled to interposer 104 through pads 107. Each of pads 107 is coupled to a respective one of pads 110 of interposer 104 through a respective bump 108. IC dies 102 can be formed out of a variety of known different materials used to create an IC die (e.g., semiconductor materials such as Silicon).

Interposer 104 interconnects IC dies 102 to one another and connects IC dies 102 to packaging substrate 106. For example, in one implementation, interposer 104 can include patterned metal layers and vias that together route signals between IC dies 102 and/or between dies 102 and package substrate 106. As shown in FIG. 1, pads 112 of interposer 104 are coupled to respective ones of pads 116 of package substrate 106 through bumps 114.

Package substrate 106 is configured to route signals received at pads 116 to respective ones of solder balls 124. For example, in one implementation, package substrate 106 can include patterned metal layers and/or vias that route signals between pads 116 and pads 122. Interposer 104 and package substrate 106 can be formed using a dielectric material, e.g., FR4. For example, substrate 106 can be an interdigitation of conductive layers and non-conductive layers that can include vias for routing signals among the layers. For example, as shown in FIG. 1, pads 116 can be coupled to pads 122 through vias 118 and/or traces 120. In one implementation, IC device 100 may be mounted to a printed circuit board (PCB) (not shown in FIG. 1). In such an implementation, solder balls 124 can be coupled to respective conductive areas on the PCB to allow for connections between IC device 100 and other devices mounted on the PCB.

Pads 107, 110, 112, 116, and 122 can be formed by etching or otherwise patterning a layer of metallic material (e.g., a copper layer). Bumps 108 and 114 can be formed out of solder and can be bonded to respective pads using a reflow process.

Dies 102 can together form a complete IC design. For example, instead of fabricating larger IC dies, which often suffer from high manufacturing costs and diminished yield, an IC design can be partitioned into separate dies which are included in the same device. To increase the functionality provided by IC device 100, IC device 100 can be made denser by increasing the number of dies 102 included therein. To facilitate communications between dies 102, interposer 104 generally must be able to provide "fine" routing, e.g., routing with a relatively large number of interconnects and relatively thin traces. The size of pads 107 and 110 and bumps 108 can bottleneck in the density of the routing that interposer 104 can provide. Thus, in one implementation pads 107 and 110 and bumps 108 can be micropads and microbumps, respectively. For example, micropads can have a minimum pitch of approximately 40 μm and a diameter of approximately 20 μm, while conventional bumps (e.g., C4 bumps) can have a minimum pitch of approximately 150 μm and a diameter of approximately 90 μm.

As noted above, in addition to providing interconnection between dies 102, interposer 104 also connects dies 102 to package substrate 106. Thus, while the top surface of interposer 104 includes pads 110 that may be implemented as micropads, the bottom surface of interposer 104 includes pads 112 that are configured to facilitate connections to package substrate 106. For example, in one implementation, pads 112 can be C4 pads that are sized so as to enable them to be coupled to C4 bumps.

Although micropads allow for higher density interconnections, problems arise when IC dies having micropads must be tested. In particular, probes used for testing IC dies are sized to contact C4 pads. When used to test IC dies that have micropads, the probes can damage the micropads when it contacts the micropads.

To avoid damage from probes, other implementations have used "sacrificial pads." Sacrificial pads are pads used exclusively for testing IC dies (not to provide connections to other elements, such as an interposer). By contacting the sacrificial pads instead of the micropads, damage to microbumps during testing can be avoided while still allowing for high density routing within the IC device.

Although these sacrificial pads can reduce damage to microbumps during testing, incorporating sacrificial pads into the layout of a surface of an IC die can often be detrimental to the rest of the layout. In particular, sacrificial pads, often being larger than the other pads of a layout, can disrupt the spacing and layout of the rest of the IC die. In doing so, sacrificial pads can result in a substantial reduction in available space on the surface of the IC die, thereby reducing the density of interconnections with the IC die and also increasing the presence crosstalk between traces and between the traces and the pads.

III. Exemplary Embodiments

In embodiments described herein, an IC die can have clusters formed thereon. Each cluster can be include micropads and sacrificial pads of an IC die. Each of the clusters can, for example, include one or more micropads and one or more sacrificial pads. Each one of the micropads is electrically coupled to a circuit associated with the cluster through, at least, a respective via. In an embodiment, the respective via can facilitate communication between the circuit the outside world (e.g., other circuits included in dies in the same IC package or other IC packages mounted on a PCB). The one or more sacrificial pads are coupled to the circuit associated with the cluster through connections with the one or more micropads. For example, the one or more sacrificial pad can be coupled to a corresponding one of the one or more micropads through a respective trace. As will be described in greater detail below, arranging micropads and sacrificial pads in clusters can increase the distance between clusters, thereby allowing for more surface real estate for traces and decreasing crosstalk.

Figure 2:
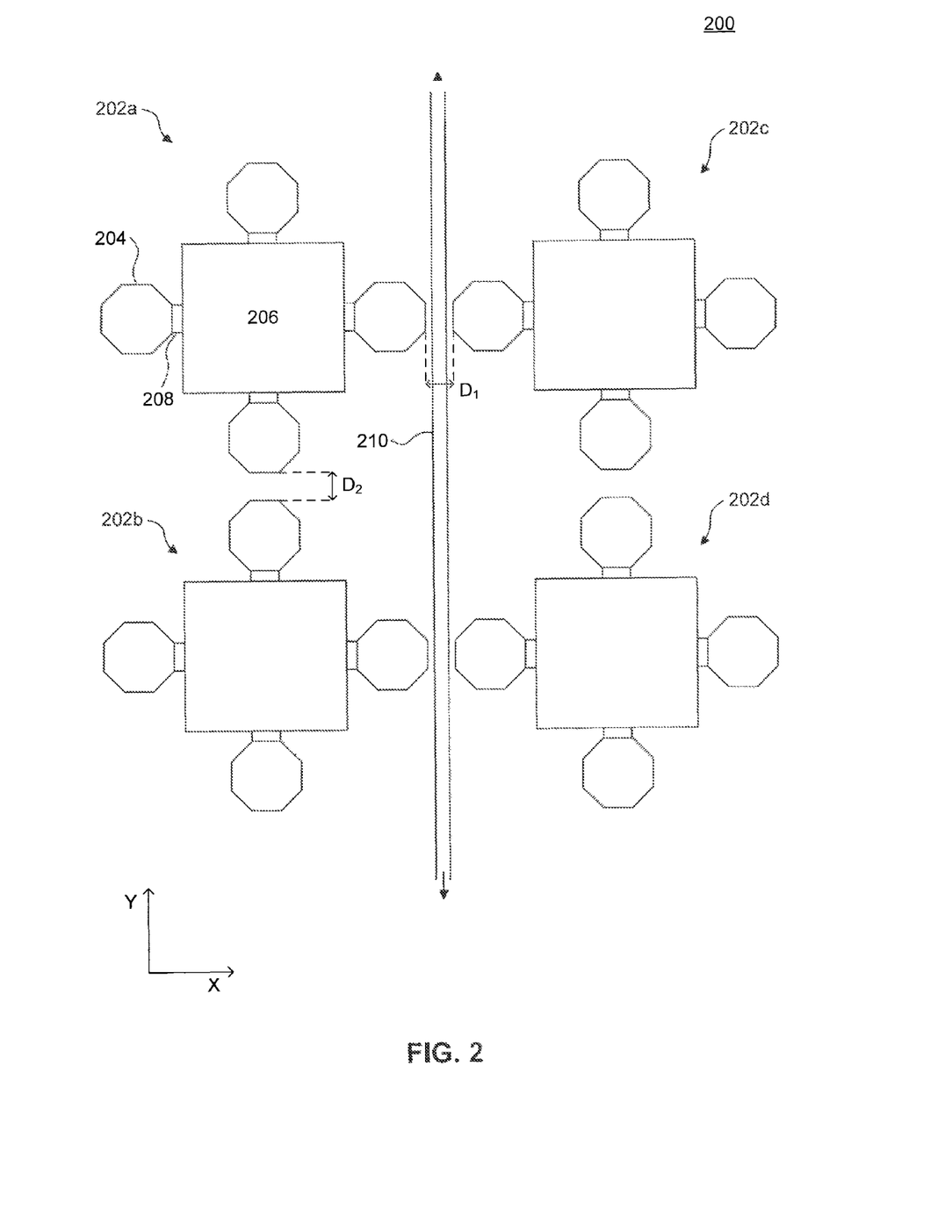
FIG. 2 shows a Layout of a bottom surface of an IC die, acc ding to an embodiment.

FIG. 2 shows a layout 200 of a bottom surface of an IC die, according to an embodiment of the present invention. Layout 200 includes four clusters 202 (individually referenced as clusters 202a-202d for ease of reference). As will be appreciated by those skilled in the relevant art based on the description herein, layout 200 is depicted as including four clusters for the purposes of explanation only. In alternate embodiments, layout 200 can include additional or fewer clusters.

Each of clusters 202 includes micropads 204 and a sacrificial pad 206. Each micropad 204 is coupled to a respective sacrificial pad 206 through a respective trace 208. As shown in FIG. 2, sacrificial pads 206 are larger than micropads 204. That is, the surface area of sacrificial pads 206 is larger than the surface area of micropads 204. In an embodiment, sacrificial pads 206 are a C4 pads configured to be coupled to C4 bumps. Each of the micropads 204 can be sized to be coupled to a respective microbump. As shown in FIG. 2, micropads 204 are arranged substantially equidistant from the center of sacrificial pad 206. However, in other embodiments, micropads 204 can be arranged in other configurations with respect to a respective sacrificial pad 206.

Moreover, micropads 204 and sacrificial pads 206 are shown as octagons and squares, respectively. In other embodiments, however, micropads 204 and sacrificial pads 206 can be formed in different shapes. For example, micropads 204 and/or sacrificial pads 206 can be formed as circles, ellipses, triangles, etc.

In the embodiment shown in FIG. 2, clusters 202 are uniformly spaced. In particular, a distance between clusters 202 in the (x) Cartesian direction, $D_1$, is equal to the distance between clusters 202 in the (y) Cartesian direction, $D_2$. In an embodiment $D_1$ and $D_2$ are approximately 14 µm, however other distances can be used. In alternate embodiments, clusters 202 may be non-uniformly spaced.

Layout 200 further includes a trace 210 that passes between adjacent ones of clusters 202. Trace 210 can couple two or more micropads 204 of different clusters 202.

Figure 3:
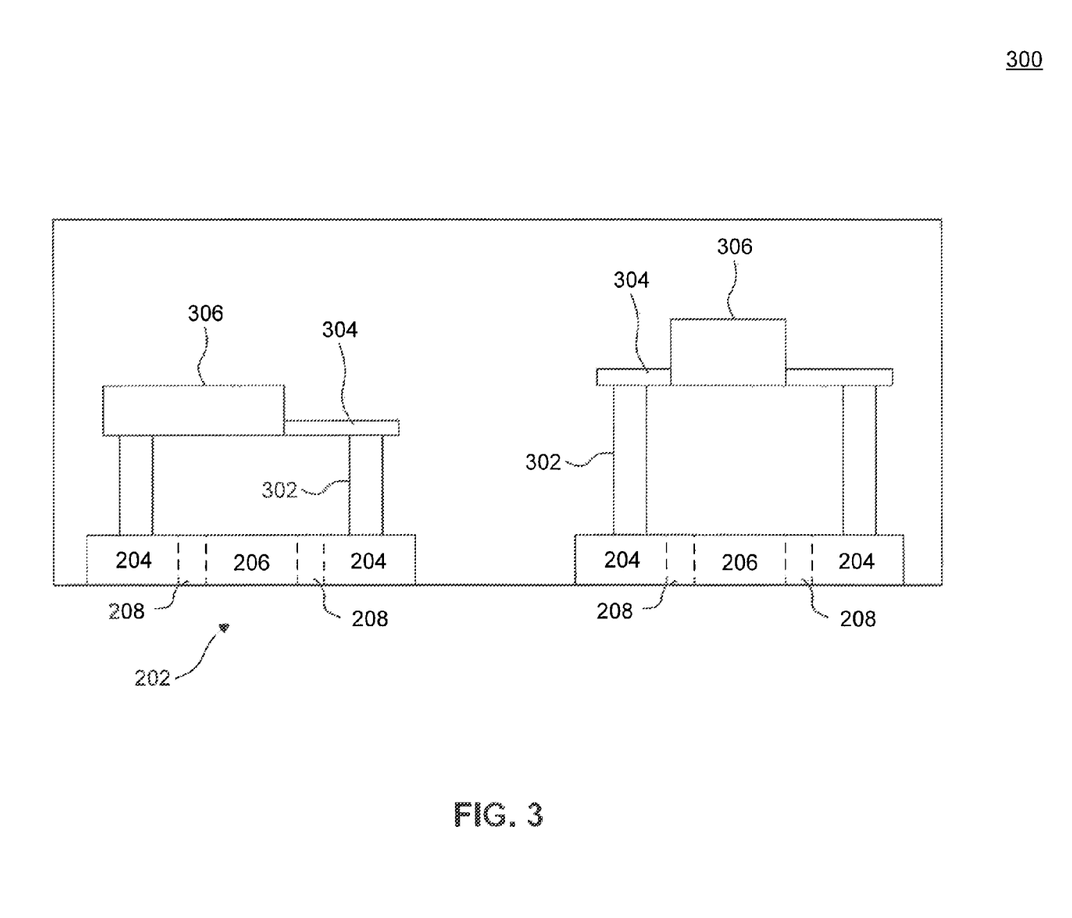
FIG. 3 shows a cross-sectional diagram of an IC die, according to an embodiment.

FIG. 3 shows a cross-section of an IC die 300 incorporating layout 200. As shown in FIG. 3, each cluster 202 is coupled to a respective circuit 306 formed in a layer IC die 300. For example, each of micropads 204 can be coupled to a respective circuit 306 through vias 302 and/or traces 304. In a further embodiment, sacrificial pads 206, are not directly connected to their respective circuit. Rather, sacrificial pads 206 can be indirectly coupled to their respective circuits through connections with micropads 204 provided by traces 208. Thus, when IC die 300 is tested, the probe can make contact with a sacrificial pad 206 and test respective circuits 306 without damaging micropads 204. Thus, IC die 200 can benefit from the increased routing density provided by micropads 204 without risking damage during testing through the use of sacrificial pads 206.

Figure 4:
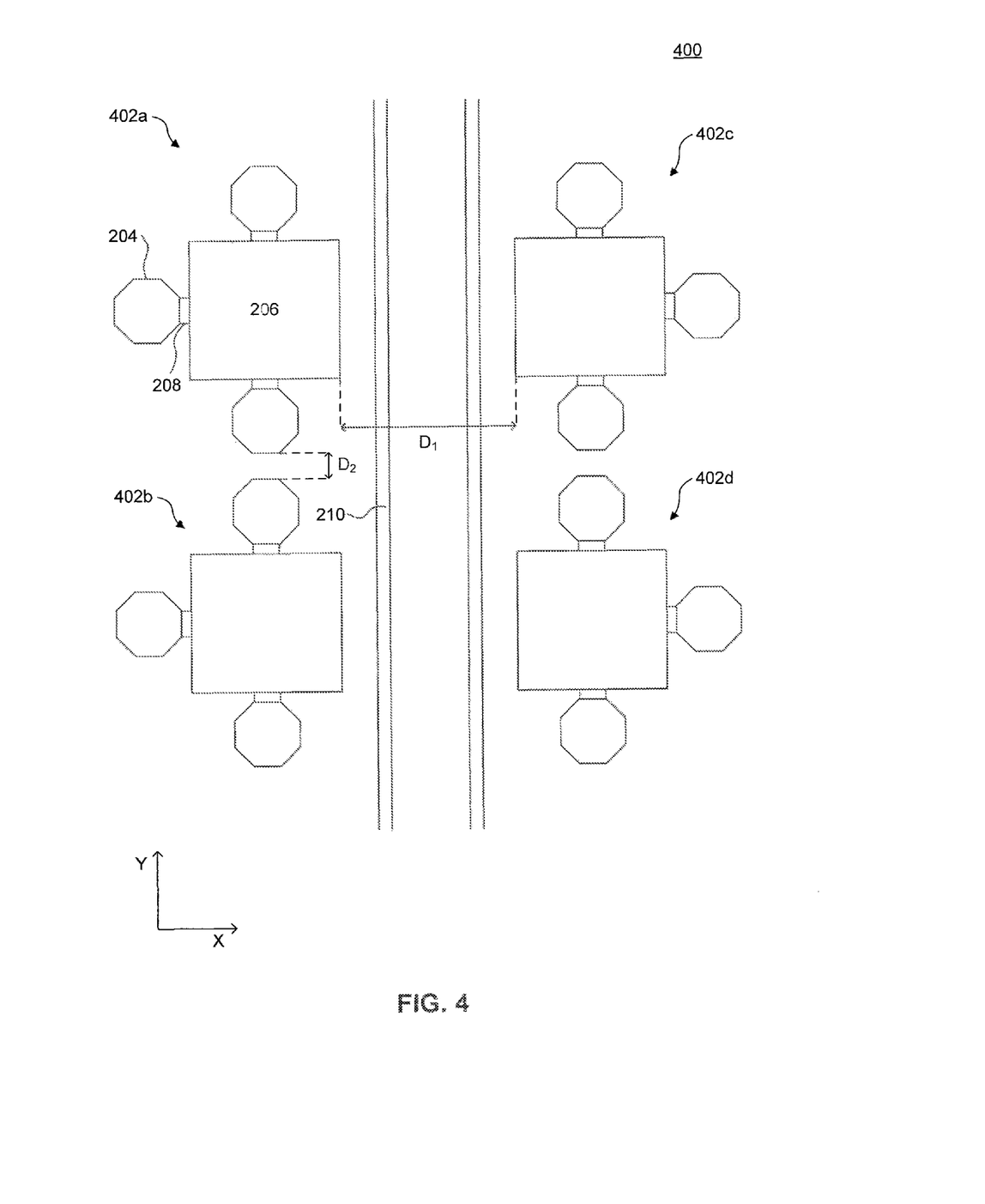
FIGS. 4-7 show layouts of bottom surfaces of an IC die, according to embodiments.

FIG. 4 shows a diagram of a layout 400 of an IC die, according to an embodiment. As shown in FIG. 4, layout 400 includes four clusters 402 (individually referenced as clusters 402a-402d, for ease of reference). As will be appreciated by those skilled in the relevant art based on the description herein, layout 400 is depicted as including four clusters for the purposes of explanation only. In alternate embodiments, layout 400 can include additional or fewer clusters.

Each of clusters 402 is similar to clusters 202 described with reference to FIG. 2, except that one of micropads 204 is removed. Thus, as shown in FIG. 4, micropads 204 remain equidistant from a center portion of their respective sacrificial pad 206. However, the spacing between adjacent ones clusters 402 is greatly increased. For example, as shown in FIG. 4, the distance between adjacent clusters 402 in the (x) direction, $D_1$, is larger than the distance between adjacent clusters 402 in the (y) direction, $D_2$. In an embodiment, $D_1$ is approximately 71 µm and $D_2$ is approximately 14 µm. In alternative embodiments, however, other distances can be used for $D_1$ and $D_2$.

In an embodiment, increasing the spacing between adjacent clusters decreases the crosstalk between clusters and allows for an increased number of traces to pass between the clusters. For example, as shown in FIG. 4, two traces 210 pass between clusters 402 that are adjacent in the (x) Cartesian direction.

Figure 5:
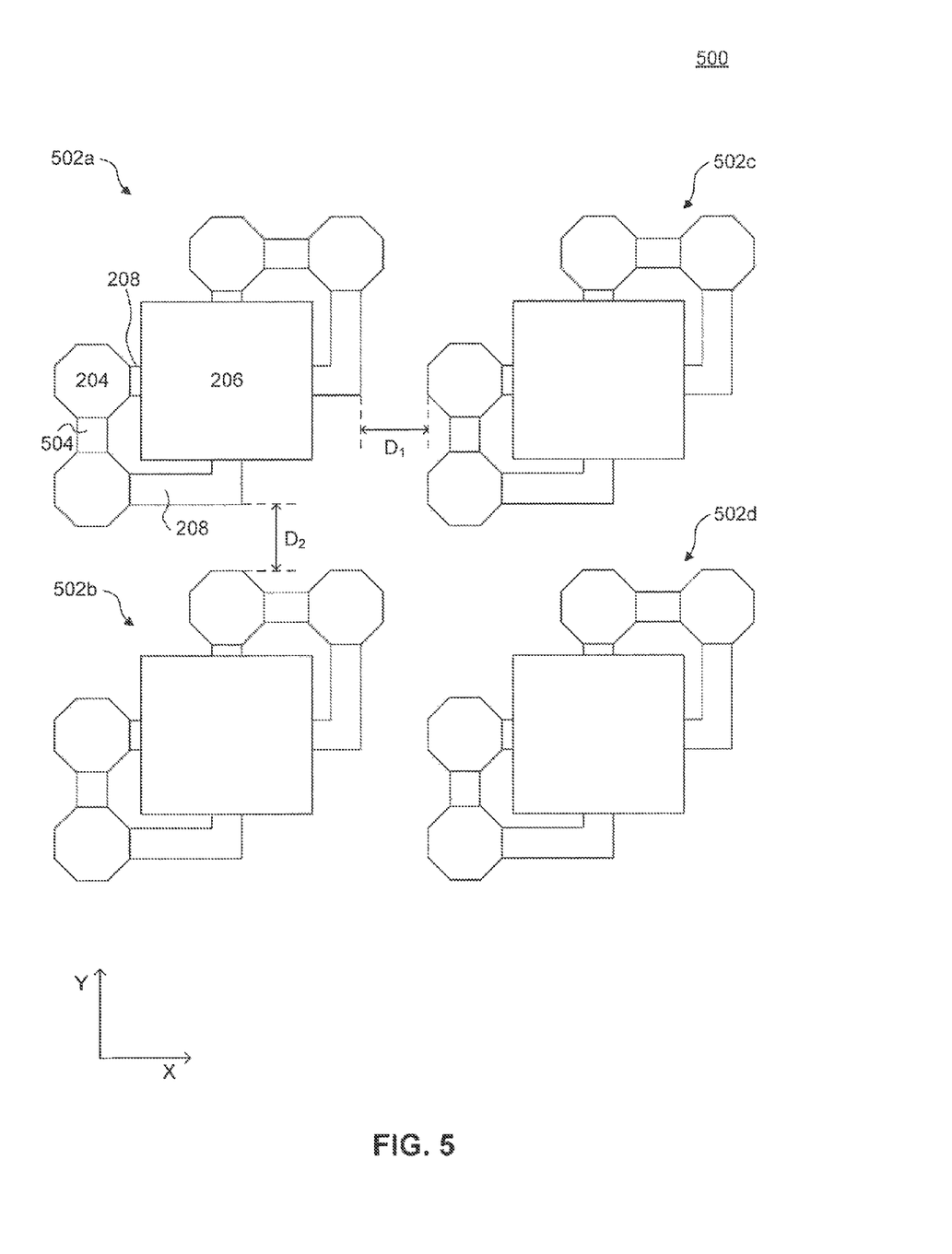

FIG. 5 shows a diagram of a layout 500 of a bottom surface of an IC die, according to an embodiment. As shown in FIG. 5, layout 500 includes four clusters 502 (individually referenced as clusters 502a-502d for ease of reference). Clusters 502 are similar to clusters 202 described with reference to FIG. 2, except that in each of clusters 502, each of micropads 204 is coupled to another one of micropads 204 through a respective trace 504. In an embodiment, coupling pairs of micropads 204 with respective traces 504 increases the current handling capacity of the pair of micropads 204.

Moreover, as shown in FIG. 5, each of traces 504 runs in a Cartesian direction. For example, in each of clusters 502, one trace 504 runs in the (x) Cartesian direction and another trace in the (y) Cartesian direction. In an embodiment, traces 504 can run in a specific Cartesian direction to comply with design rules used to fabricate layout 500.

As shown in FIG. 5, clusters 502 are uniformly spaced. More specifically, the distance between clusters adjacent in the (x) Cartesian direction, $D_1$, and the distance between clusters adjacent in the (y) direction, $D_2$, is equal. In an embodiment, $D_1$ and are approximately 27 µm.

Figure 6:
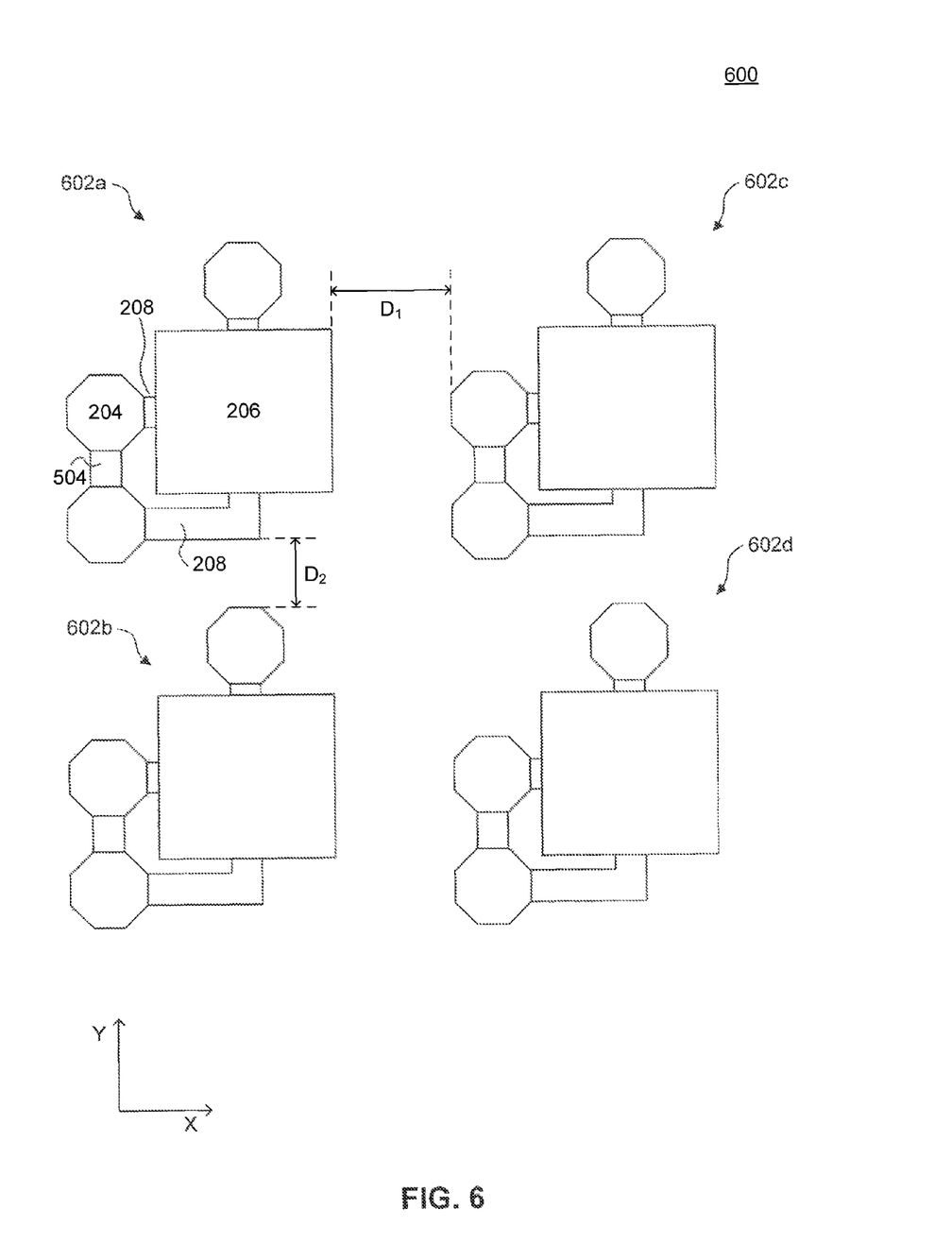

FIG. 6 shows a diagram of a layout 600 of the bottom surface of an IC die, according to an embodiment. As shown in FIG. 6, layout 600 includes four clusters 602 (individually referenced as clusters 602a-602d for ease of reference). As will be appreciated by those skilled in the relevant art based on the description herein, layout 600 is depicted as including four clusters for the purposes of explanation only. In alternate embodiments, layout 600 can include additional or fewer clusters.

Clusters 602 are substantially similar to clusters 502, except that each of clusters 602 has one micropad 204 removed. As described above in referenced to FIG. 3, removing a micropad of a cluster for each cluster in a layout, increases the distances between clusters. For example, in the embodiment of FIG. 6, removing a micropad from each cluster increases the distance between clusters adjacent in the (x) Cartesian direction, $D_1$. In an embodiment, $D_1$ can be approximately 43 gm and the distance between clusters 602 adjacent in the (y) Cartesian direction, $D_2$, is approximately 27 µm. In alternate embodiments, however, other distances can be used for distances $D_1$ and $D_2$.

Figure 7:
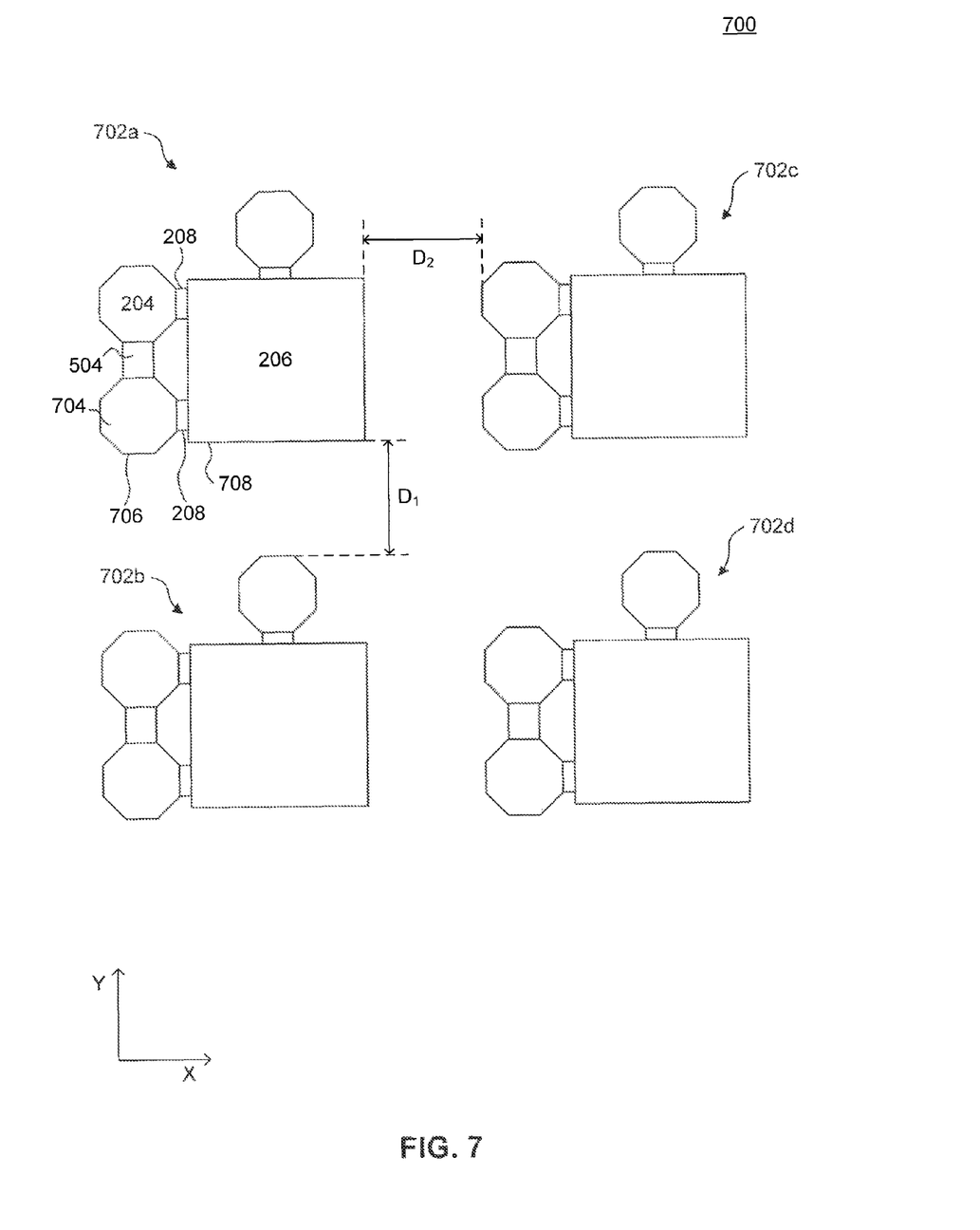

FIG. 7 shows a diagram of a layout 700 of the bottom surface of an IC die, according to an embodiment. As shown in FIG. 7, layout 700 includes four clusters 702 (individually referenced as clusters 702a-702d for ease of reference). As will be appreciated by those skilled in the relevant art based on the description herein, layout 700 is depicted as including four clusters for the purposes of explanation only. In alternate embodiments, layout 700 can include additional or fewer clusters.

Each of clusters 702 is substantially similar to clusters 602 described with reference to FIG. 6, except that in clusters 702, the alignment of micropads 204 is adjusted. For example, as shown in FIG. 7, micropad 704 of cluster 702a is shifted such that outer surface 706 of micropad 704 substantially coincides with outer surface 708 of sacrificial pad 206. In doing so, trace 208 that couples micropad 704 to sacrificial pad 206 travels in a single Cartesian direction (e.g., the (x) Cartesian direction), thereby reducing the size of this trace 208.

Moreover, in the embodiment of FIG. 7, clusters 702 are substantially uniformly spaced. For example, the distance between clusters 702 in the (x) Cartesian direction, $D_1$, is approximately equal to the distance between clusters 702 in the (y) Cartesian direction, $D_2$. In a further embodiment, $D_1$ and $D_2$ are approximately equal to 43 µm, however other distances can be used. In alternate embodiments, clusters 202 may be non-uniformly spaced.

Figure 8:
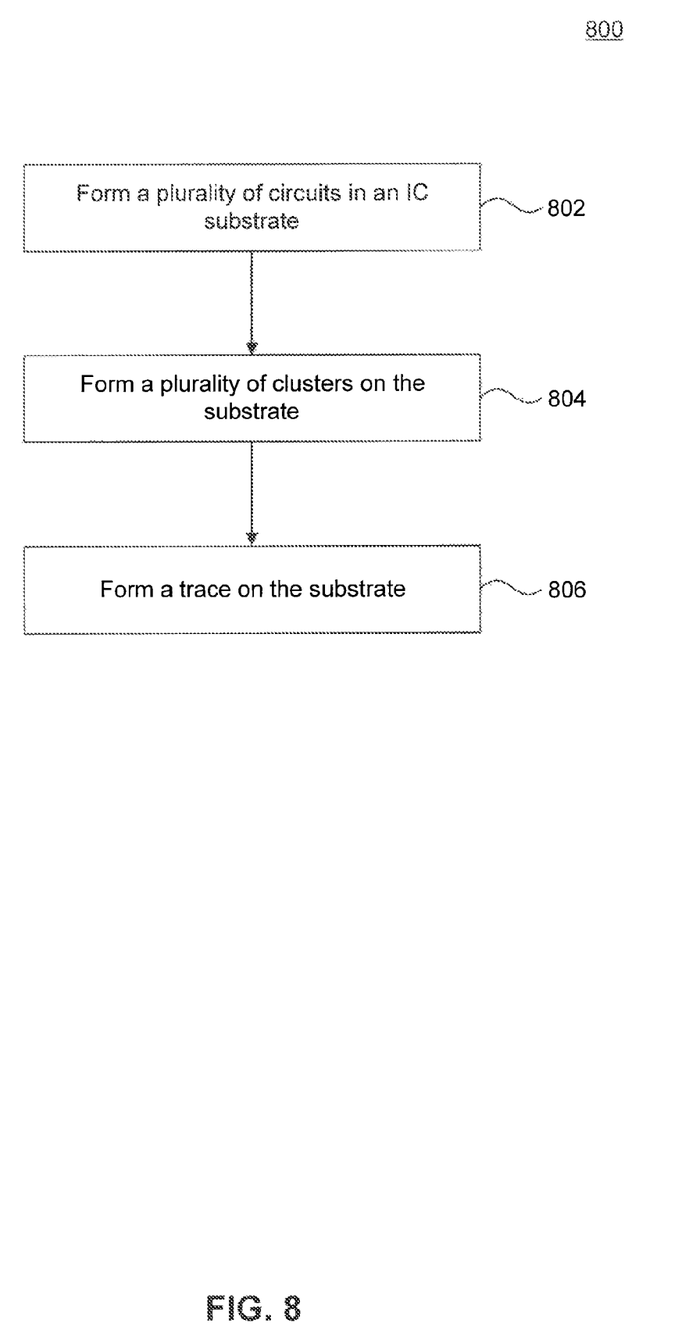
FIG. 8 is flowchart of a method of fabricating an IC die, according to some embodiments of the disclosed subject matter The disclosed subject matter will now be described with reference to the accompanying drawings. In the drawings, like reference numbers indicate identical or functionally similar elements. Additionally, the left-most digit(s) of a reference number identifies the drawing in which the reference number first appears.

FIG. 8 shows a flowchart depicting a method 800 for manufacturing an IC die, according to some embodiments of the disclosed subject matter. Not all steps of method 800 maybe required, nor do all the steps shown in FIG. 8 necessarily have to occur in the order shown.

In step 802, a plurality of circuits is formed in an IC die. For example, as shown in FIG. 3, circuits 306 can be formed in an IC substrate (e.g., a Silicon substrate).

In step 804, a plurality of clusters is formed on the substrate. For example, the clusters can be formed according to any of the layouts shown in FIGS. 2, and 4-7.

In step 806, traces are formed on the IC substrate. For example, in FIGS. 2 and 3, traces 210 can be formed on the surface of the IC substrate. In an embodiment, clusters and traces can be formed by etching or otherwise patterning a layer of conductive metal, e.g., copper.

Embodiments of the disclosed subject matter have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

IV. Conclusion

It is to be appreciated that the Detailed Description section, and not the Abstract section, is intended to be used to interpret the claims. The Abstract section can set forth one or more, but not all exemplary embodiments, of the disclosure, and thus, are not intended to limit the disclosure and the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

It will be apparent to those skilled in the relevant art(s) that various changes in form and detail can be made therein without departing from the spirit and scope of the disclosure. Thus the disclosure should not be limited by any of the above-described exemplary embodiments, but should be defined only in accordance with the following claims and their equivalents.

What is claimed is:

1. An integrated circuit (IC) die, comprising:
   a plurality of clusters of pads formed on a surface of the IC die, wherein each cluster is associated with a respective circuit formed in the IC die and wherein each cluster comprises:
      a plurality of micropads each electrically coupled to the circuit associated with the cluster through a respective via; and
      a sacrificial pad coupled to the circuit through the plurality of micropads, the sacrificial pad being larger than each of the micropads.

2. The IC die of claim 1, wherein each micropad is configured to be physically and electrically connected to a respective microbump.

3. The IC die of claim 1, wherein, for each cluster, each micropad is electrically coupled to the sacrificial pad through a respective trace formed on the surface of the IC die.

4. The IC die of claim 1, further comprising:
   a trace located between first and second adjacent clusters of the plurality of clusters.

5. The IC die of claim 1, wherein, for each cluster, each micropad of the plurality of micropads is substantially equidistant from a center of the sacrificial pad.

6. The IC die of claim 5, wherein at least one plurality of micropads of the plurality of micropads comprises at least three micropads.

7. The IC die of claim 6, wherein the plurality of clusters of pads comprises first, second, and third clusters, wherein the second and third clusters are adjacent to the first cluster and wherein a distance between the first and second clusters is larger than a distance between the first and third clusters.

8. The IC die of claim 1, wherein each plurality of micropads comprises first and second micropads and wherein each of the clusters comprises a trace that interconnects the first and second micropads of the plurality of micropads.

9. The IC die of claim 8, wherein the trace is formed in a first direction.

10. The IC die of claim 9, wherein each plurality of micropads further comprises third and fourth micropads, wherein each of the clusters further comprises a second trace that interconnects the third and fourth micropads, and wherein the second trace is formed in a second direction that is perpendicular to the first direction.

11. The IC die of claim 8, wherein an outer surface of the first micropad substantially coincides with an outer surface of the sacrificial pad in a second direction and wherein the second direction is perpendicular to a first direction.

12. The IC die of claim 8, wherein the plurality of clusters comprises first, second, and third clusters, wherein the second and third clusters are adjacent to the first cluster and wherein a distance between the first and second clusters is larger than a distance between the first and third clusters.

13. The IC die of claim 8, wherein each plurality of micropads further comprises a third micropad and wherein the first and third micropads of each plurality of micropads are substantially equidistant from a center of a respective sacrificial pad.

14. The IC die of claim 1, wherein the sacrificial pad is sized to be coupled to a C4 bump.

15. A method of manufacturing an integrated circuit (IC) die, comprising:
   forming a plurality of circuits in a substrate; and
   forming a plurality of clusters on a surface of the substrate, each cluster comprising:
      a plurality of micropads each electrically coupled through a respective via to a circuit respective to the cluster; and
      a sacrificial pad coupled to the circuit through the plurality of micropads, the sacrificial pad being larger than each of the micropads.

16. The method of claim 15, further comprising:
   forming a trace between first and second adjacent clusters of the plurality of clusters.

17. The method of claim 16, wherein forming the trace comprises: forming the trace in a first direction.

18. The method of claim 15, wherein forming the plurality of clusters comprises:
   forming at least three micropads in each cluster.

19. The method of claim 17, wherein forming the plurality of clusters comprises:
   forming first, second, and third clusters such that the second and third clusters are adjacent to the first cluster and a distance between the first and second clusters is larger than a distance between the first and third clusters.

20. The method of claim 15, wherein forming the plurality of clusters comprises:
   for each cluster, forming first and second micropads; and for each cluster, forming a trace that interconnects the first and second micropads of the plurality of micropads.

\* \* \* \* \*